US006282676B1

(12) United States Patent
Cheng

(10) Patent No.: US 6,282,676 B1
(45) Date of Patent: Aug. 28, 2001

(54) METHOD AND APPARATUS FOR TESTING AND DEBUGGING INTEGRATED CIRCUIT DEVICES

(75) Inventor: Liao-Shun Cheng, Hsinchu (TW)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 09/281,701

(22) Filed: Mar. 30, 1999

(51) Int. Cl.⁷ .................................. G11B 5/00; G06K 5/04
(52) U.S. Cl. ........................................................... 714/700
(58) Field of Search .................................. 714/700, 724, 714/736, 747, 819

(56) References Cited

U.S. PATENT DOCUMENTS 4,928,278   5/1990  Otsuji et al. ........................ 714/700
5,319,224 *  6/1994  Sakashita et al. .................. 257/203
5,432,797   7/1995  Takano ............................... 714/738

* cited by examiner

Primary Examiner—Phung M. Chung
(74) Attorney, Agent, or Firm—Coudert Brothers

(57) ABSTRACT

A method for testing and debugging a first IC (integrated circuit) device by use of an error-free second IC device is provided in the invention. The second IC device is identical to the first IC device. The method utilizes a comparator circuit to compare output of the first IC device with output of the second IC device for generating an error signal when a predetermined criterion is met. Thereby, the first IC device can be detected error points thereof accurately, if it has. Furthermore, the I/O history of the first IC device ahead and behind of one error point can be monitored. This provides accurate test result and valuable reference for correction of the first IC device when the first IC device has error points. The concept and spirit of this present invention are applicable to digital and analog types of IC devices. The test method according to the invention can enhance test reliability and shorten test time.

12 Claims, 3 Drawing Sheets

METHOD AND APPARATUS FOR TESTING AND DEBUGGING INTEGRATED CIRCUIT DEVICES

FIELD OF INVENTION

Figure 1:
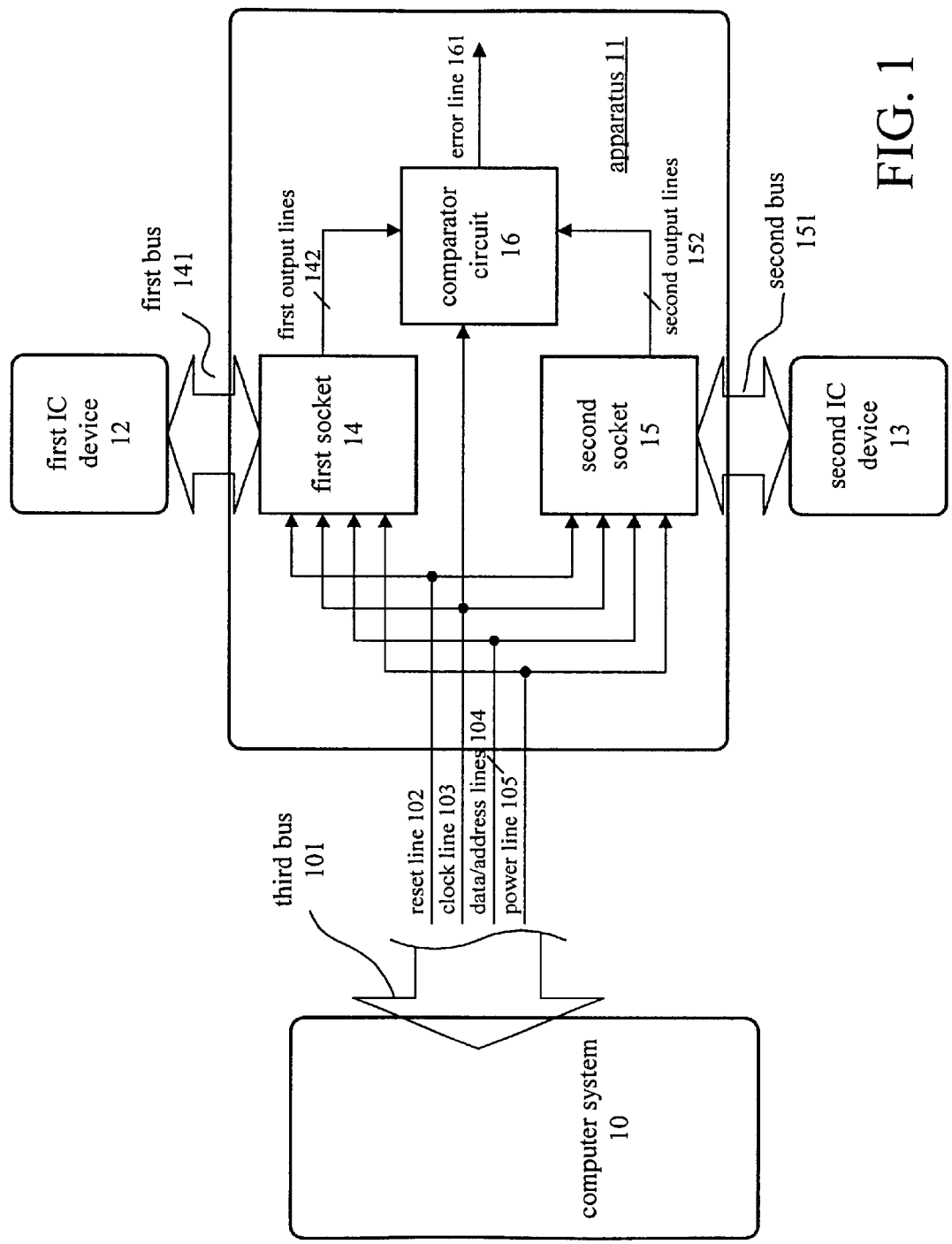

The present invention relates to a method and an apparatus for testing and debugging a first IC device, and in particular, to a method and an apparatus for testing an IC device by use of a second IC device which is identical to the first IC device and has been confirmed to be error-free.

BACKGROUND OF INVENTION

After being manufactured, an IC device must be tested functions thereof to assure quality thereof With respect to the testing of IC devices, a conventional approach utilizes a series of test patens to test functions of a tested IC device. By the series of test patens, the designer attempts to emulate all possible conditions under the actual operation environment in the test environment, but it is usually impossible. To date, the conventional approach in which one individual IC device is tested under a series of test patens is still employed in several prior arts, e.g., U.S. Pat. Nos. 4,928,278 and 5,432,797.

However, according to the practical experiences, one IC device, which pass the function test of the conventional approach, may still malfunction under actual operation environment. This cause is that the test patens and fault coverage of the conventional approach cannot accurately emulate whole possible conditions under actual environment. Moreover, for detecting the error point of the malfunctioning IC device, the designer must add other test patens to the series of test patens and then re-test the IC device. The procedure mentioned above is repeated until the error point of the IC device is detected. It is evident that the conventional approach consumes much time and cost, and that the test reliability of the IC device tested by the conventional approach is very low.

Accordingly, an objective of the invention is to provide a rapid and reliable method for testing and debugging an IC device. In particular, the invention provides a method for testing and debugging a first IC device by use of an error-free second IC device. The second IC device is identical to the first IC device, i.e., the first and second IC devices follow the same specification and have the same I/O layout. The method of the invention can detect an error point of one malfunctioning IC device accurately. Furthermore, the I/O history of the malfunctioning IC device ahead and behind of the error point thereof can be monitored. This can provide accurate test result and valuable reference for correction of the malfunctioning IC device.

The concept and spirit of this present invention are applicable to digital and analog types of IC devices.

SUMMARY OF INVENTION

An objective of the invention is to provide a method for testing and debugging a first IC device by use of an error-free second IC device. The second IC device is identical to the first IC device, i.e., the first and second IC devices follow the same specification and have the same I/O layout. The error-free second IC device means that the second IC device has been confirmed to operate normally under actual operation environment. The invention can shorten test time and enhance test reliability for the function test of the first IC device.

According to the invention, the method utilizes a test apparatus including a comparator circuit and communicating with a computer system via bus including a clock signal. A testing utility is executed in the computer system during the test. The comparator circuit compares output of the first IC device with output of the second IC device, and is operated by the clock signal to generate an error signal when a predetermined criterion is met. The concept and spirit of the invention are applicable to digital and analog types of IC devices.

According to the invention, an apparatus is provided for testing a first IC device by use of an error-free second IC device identical to the first IC device. The apparatus communicates with a computer system via a bus. The bus includes a clock signal outputted from the computer system in which a testing utility is executed during test. The apparatus comprises a comparator circuit, a first connection device, and a second connection device. The comparator circuit is operated by the clock signal, and communicates with the first IC device and the second IC device via first I/O lines and second I/O lines, respectively. The first connection device is provided for making connection of the first IC device to the computer system via the bus and to the comparator circuit via the first I/O lines, respectively. The second connection device is provided for making connection of the second IC device to the computer system via the bus and to the comparator circuit via the second I/O lines, respectively. The comparator circuit compares data on the first I/O lines and the second I/O lines for generating an error signal when a predetermined criterion is met. By comparing with the error-free second IC device, the first IC device can be detected error points thereof accurately, if it has, only under the test utility rather than a larger number of test patens. Consequently, with the test apparatus according to the invention, the test time of the first IC device can be shorten and the test reliability of the first IC device can be enhanced.

BRIEF DESCRIPTION OF THE APPENDED DRAWINGS

FIG. 1 discloses the configuration of a test apparatus, according to an embodiment of the invention, for testing an IC device with a plurality of output terminals.

Figure 2A:
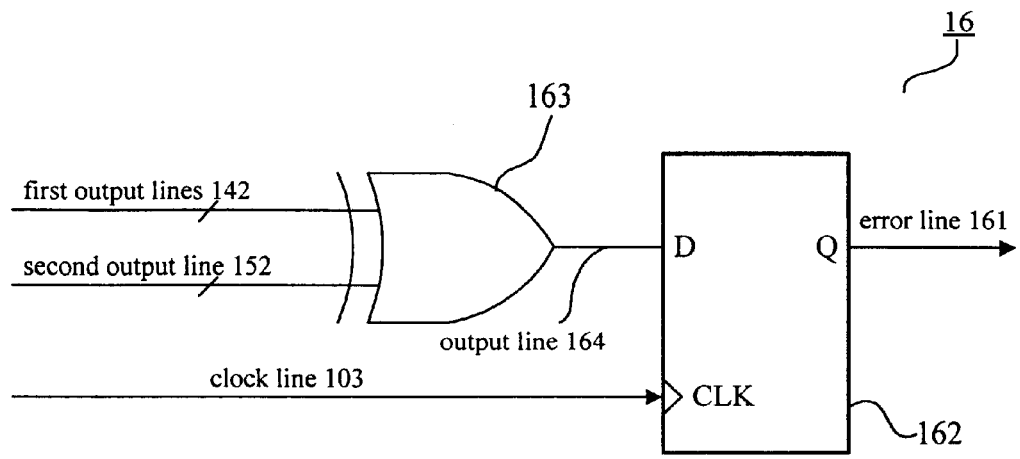

FIG. 2A is a circuit diagram schematically showing a preferred embodiment of the comparator circuit 16 in FIG. 1.

Figure 2B:
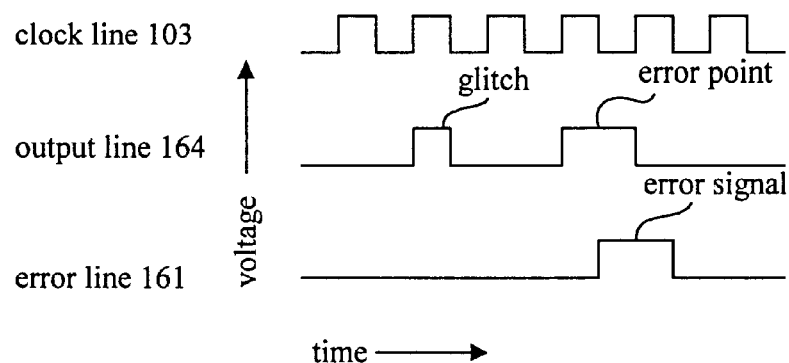

FIG. 2B is a timing diagram illustrating the timing of signals on the clock line 103, the output line 164, and the error line 164 in the comparator circuit of the FIG. 2A.

Figure 3:
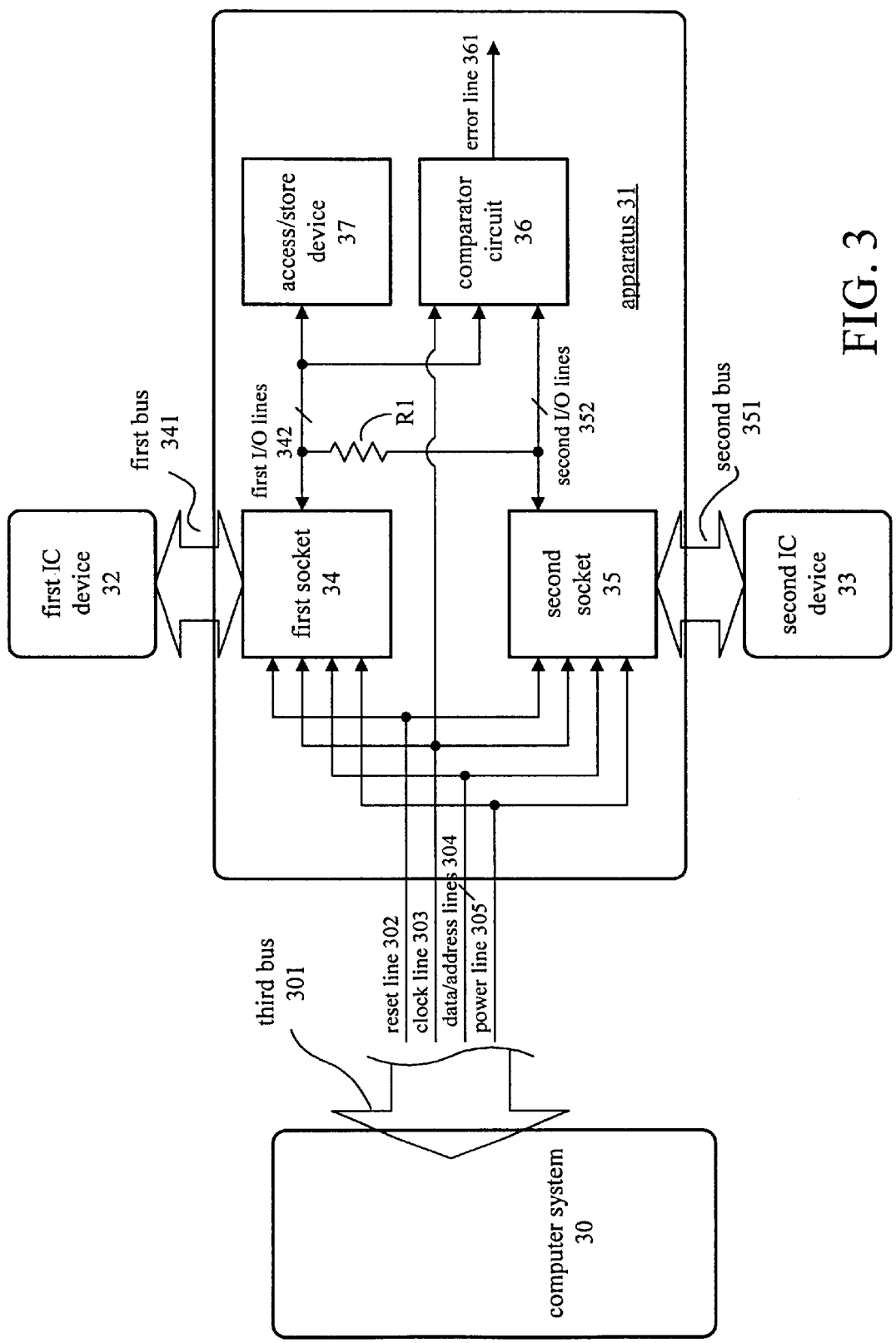

FIG. 3 shows how the invention tests an IC device with a plurality of I/O terminals.

DETAILED DESCRIPTION OF THE INVENTION

The invention provides a method for testing and debugging a first IC device by use of a second IC device identical to the first IC device. That is the first IC device and the second IC device follow the same specification and have the same I/O layout The second IC device has been confirmed to be error-free, i.e., the second IC has been confirmed to work normally under actual operation environment. According to the invention, a test signal are transmitted to the first and second IC devices synchronously and successively. By a comparator circuit, output of the first IC device is compared with output of the second IC device. The comparator circuit is capable of generating an error signal when a predetermined criterion is met. Thereby, the operator can easily detect an error point of the first IC device. Differing to the conventional approach, the invention can detect error point of the IC device accurately only under a testing utility rather than a large number of test patens. Therefore, the invention can shorten test time significantly for the function test of the first IC device. The concept and spirit of the invention are applicable to digital type of IC devices, such as memory devices, and analog type of IC devices, such as graphic chip devices. Several embodiments of the invention are disclosed as follows.

In an embodiment of the invention, as illustrating in FIG. 1, a first IC device 12 is tested by an error-free second IC device 13. The second IC device 13 is identical to the first IC device 12. The first IC device 12 and the second IC device 13 include a plurality of output terminals, respectively. According to the invention, the test method utilizes a test apparatus 11 to communicate with the first IC device 12, the second IC device 13, and a computer system 10 via a first bus 141, a second bus 151, and a third bus 101, respectively. During the test, a testing utility is executed in the computer system 10. The test apparatus 11 includes a first socket 14 for receiving the first IC device 12 and a second socket 15 for receiving the second IC device 13. The third bus 101 includes a reset line 102, a clock line 103, a multiple of data/address lines 104, and a power line 105. The third bus 101 is electrically connected to the first bus 141 and the second bus 151, respectively. The first bus 141 also includes first output lines 142 connected to the output terminals of the first IC device 12. The second bus 151 also includes second output lines 152 connected to the output terminals of the second IC device 13. The test apparatus also includes a comparator circuit 16 electrically connected to the clock line 103 and the first output lines 142 the second output lines 152, respectively.

With the embodiment of FIG. 1, the method, provided by the invention, of testing the first IC device 12 by use of the error-free second IC device 13 includes the following steps.
1. Applying a power supply to the first and second IC devices (12 and 13) by the computer system 10 during the test.
2. Transmitting a reset signal to the first and second IC devices (12 and 13) from the computer system 10 synchronously at the start of the test to set the first and second IC devices (12 and 13) at the same status.
3. Transmitting a clock signal to the first IC device 12, the second IC device 13, and the comparator circuit 16 from the computer system 10 synchronously and successively after the transmission of the reset signal.
4. Transmitting a multiple of data/address signals to the first and second IC devices (12 and 13) from the computer system 10 synchronously and successively after the transmission of the reset signal.
5. Comparing data on the first output lines 142 and the second output lines 152 by the comparator circuit 16.
6. Outputting an error signal from the comparator circuit 16 through an output line 161 of the comparator circuit 16 to indicate that the first IC device 12 is with error when a predetermined criterion is met.

It is noted that the comparator circuit 16 is operated by the clock signal for prevent from malfunctioning due to glitch induce by substantial difference between the first IC device 12 and the second IC device 13. In a preferred embodiment, the comparator circuit 16 includes a comparator 163 and a D-type flip-flop 162, shown in FIG. 2A. The comparator 163 comparator is connected to the first output lines 142 and the second output lines 152, respectively. The comparator 163 is responsible for comparing data on the first output lines 142 and the second output lines 152 for generating a comparison signal transmitted to the D-type flip-flop 162 through an output line 164. The D-type flip-flop 162 is connected to the clock line 103. The D-type flip-flop 162 receives the clock signal from the computer system 10 and the comparison signal from the comparator 163. The D-type flip-flop 162 is operated by the clock signal. Referring to FIG. 2B, the timing diagram of signals on the clock line 103, the output line 164 and the error line 161 are described illustratively. In logic estimate of the D-type flip-flop 162, cycle number of a pulse induced by a glitch is substantially less than a predetermined cycle number, and thus no error signal is generated. Otherwise, cycle number of a pulse induced by an error point of the first IC device is substantially more than the predetermined cycle number, and thus a corresponding error signal is generated. The predetermined criterion of the logic estimate of the comparator circuit has been described with the preferred embodiment mentioned above. However, anyone who is skilled in the arts is likely to make various modifications suitable for various types of IC devices.

By the invention, the operator can detect error point of the IC devices. Therefore, the invention is applicable in quality control of the IC devices to detect poor products rapidly. Furthermore, the operator can monitor the I/O history of one IC device with error point. Therefore, the invention is also applicable in debugging of the IC devices. By the invention, the designer can obtain accurate test result and valuable reference for correction of the IC devices with error point.

Referring to FIG. 3, in another embodiment, a first IC device 32 with a plurality of I/O terminals, such as a memory device, is tested in accordance with the invention. For detecting error point of the first IC device 32 accurately, output and input operations between the first IC device and one matched access/store device should be considered in the function test of the first IC device 32. In the same manner, the embodiment of the invention utilizes an error-free second IC device 33 to test the first IC device 32. The second IC device 33 is identical to the first IC device 32 and has a plurality of I/O terminals. As shown in FIG. 3, a test apparatus 31 is employed in the invention to communicate with the first IC device 32, the second IC device 33, and a computer system 30 via a first bus 341, a second bus 351, and a third bus 301, respectively. A testing utility is executed in the computer system 30. The test apparatus includes a first socket 34 for receiving the first IC device 32 and a second socket 35 for receiving the second IC device 33. The third bus 301 includes a reset line 302, a clock line 303, a multiple of data/address lines 304, and a power line 305. The third bus 301 is electrically connected to the first bus 341 and the second bus 351, respectively. The first bus 341 also includes first I/O lines 342 connected to the I/O terminals of the first IC device 32. The second bus 351 also includes second output lines 352 connected to the output terminals of the second IC device 33. The test apparatus 31 also includes a comparator circuit 36, an access/store device 37 matching the first IC device 32 and a suitable resistor R1. The comparator circuit 36 is electrically connected to the clock line 303 and the first I/O lines 342 the second I/O lines 352, respectively. The access/store device 37 is electrically connected to the first lines 342. The resistor R1 is connected between the first I/O lines 342 and the second I/O lines 352.

In a preferred embodiment, the first IC device 32 and the second IC device 33 are a memory device, respectively. The access/store device 37 is a microprocessor unit. Moreover, the resistor R1 is a 100 Ω resistor when the first IC device 32 and the second IC device 33 are an SRAM device, respectively.

The method with the embodiment of FIG. 3 is the same as that with the embodiment of FIG. 1. The comparator circuit 36 is capable of comparing data on the first I/O lines 342 and the second I/O lines 352 and generating an error signal when a predetermined criterion is met. During test, the first IC device 32, operated the testing utility, accesses or stores data into the access/store device 37. By the suitable resistor Rl, the signal on the second I/O lines 352 can reflect that on the first I/O lines 342 while the first IC device 32 access data from the access/store device 37. Otherwise, the substantial logic of the signal on the on second I/O lines 352 cannot be affected by that on the first I/O lines 342 while the first IC device 32 stores data into the access/store device 37. Consequently, the comparator circuit can accurately compare output difference between the first IC device 32 and the second IC device 33.

The above details of the embodiments of the invention aforesaid are illustrative rather than limiting. For instance, the components consisting of the comparator circuit according to the invention may be replaced equivalently by other forms which are obvious to persons skillful in the arts. Accordingly, any equivalent modifications, substitutes, alterations or changes to the preferred embodiment without departing form the spirit of the invention are likely to persons ordinary skill in the arts, and are still within the intended scope of the protection of the invention which is defined by the following claims and their equivalences.

What is claimed is:

1. An apparatus for testing a first IC device by use of an error-free second IC device identical to said first IC device, said apparatus communicating with a computer system via a bus, the bus including a clock signal outputted from the computer system in which a testing utility is executed during the test, said apparatus comprising:
    a comparator circuit operated by the clock signal, said comparator circuit communicating with said first IC device and said second IC device via first I/O lines and second I/O lines respectively;
    a first connection device for making connection of said first IC device to the computer system via the bus and to the comparator circuit via the first I/O lines respectively;
    a second connection device for making connection of said second IC device to the computer system via the bus and to the comparator circuit via the second I/O lines respectively; and
wherein the comparator circuit compares data on the first I/O lines and the second I/O lines for generating an error signal when a predetermined criterion is met.

2. The apparatus of claim 1, further comprising:
    an access/store device electrically connected to the first I/O lines; and
    a resistor connected between the first I/O lines and the second I/O lines;
wherein said first IC device, operated by the testing utility, accesses and stores data into the access/store device during the test.

3. The apparatus of claim 1, wherein said comparator circuit comprises:
    a comparator comparing data on the first I/O lines and the second I/O lines for generating a comparison signal; and
    a flip-flop operated by the clock signal, said flip-flop receiving the comparison signal and generating the error signal when the predetermined criterion is met.

4. An apparatus for testing a first memory device by use of an error-free second memory device identical to said first memory device, said apparatus communicating with a computer system via a bus, the bus including a clock signal outputted from the computer system in which a testing utility is executed during the test, said apparatus comprising:
    a comparator circuit operated by the clock signal, said comparator circuit communicating with said first memory device and said second memory device via first I/O lines and second I/O lines respectively;
    a first connection device for making connection of said first memory device to the computer system via the bus and to the comparator circuit via the first I/O lines respectively;
    a second connection device for making connection of said second memory device to the computer system via the bus and to the comparator circuit via the second I/O lines respectively;
    an access/store device electrically connected to the first I/O lines;
    a resistor connected between the first I/O lines and the second I/O lines; and
wherein said first memory device, operated by the testing utility, accesses and stores data into the access/store device during the test, and wherein the comparator circuit compares data on the first I/O lines and the second I/O lines for generating an error signal when a predetermined criterion is met.

5. The apparatus of claim 4, wherein said comparator circuit comprises:
    a comparator comparing data on the first I/O lines and the second I/O lines for generating a comparison signal; and
    a flip-flop operated by the clock signal, said flip-flop receiving the comparison signal and generating the error signal when the predetermined criterion is met.

6. A method for testing a first IC device by use of an error-free second IC device identical to said first IC device, said method utilizing a test apparatus to communicate with a computer system via a bus, a testing utility being executed in the computer system during the test, said test apparatus comprising a comparator circuit, said comparator circuit communicating with said first IC device and said second IC device via first I/O lines and second I/O lines respectively, said test apparatus comprising a first connection device for making connection of said first IC device to the computer system via the bus and to said comparator circuit via the first I/O lines respectively, said test apparatus also comprising a second connection device for making connection of said second IC device to the computer system via the bus and to the comparator circuit via the second I/O lines, said method comprising the steps of:
    resetting said first IC device and said second IC device by the testing utility synchronously;
    transmitting a testing signal to said first IC device and said second IC device by the testing utility synchronously and successively, and transmitting a clock signal to said first IC device, said second IC device and said comparator circuit by the testing utility synchronously and successively;
    comparing data on the first I/O lines and the second I/O lines by said comparator circuit; and
    generating an error signal from said comparator circuit when a predetermined criterion is met;
wherein said comparator circuit is operated by the clock signal.

7. The method of claim 6, wherein said test apparatus further comprises:

an access/store device electrically connected to the first I/O lines; and a resistor connected between the first I/O lines and the second I/O lines;

wherein said first IC device, operated by the testing utility, accesses and stores data from and into the access/store device during the test.

8. The method of claim 6, wherein said comparator circuit comprises:

a comparator comparing data on the first I/O lines and the second I/O lines for generating a comparison signal; and a flip-flop operated by the clock signal, said flip-flop receiving the comparison signal and generating the error signal when the predetermined criterion is met.

9. A method for testing a first memory device by use of an error-free second memory device identical to said first memory device, said method utilizing a test apparatus to communicate with a computer system via a bus, a testing utility being executed in the computer system during the test, said test apparatus comprising a comparator circuit, said comparator circuit communicating with said first memory device and said second memory device via first I/O lines and second I/O lines respectively, said test apparatus comprising a first connection device for making connection of said first memory device to the computer system via the bus and to said comparator circuit via the first I/O lines respectively, said test apparatus also comprising a second connection device for making connection of said second memory device to the computer system via the bus and to the comparator circuit via the second I/O lines, said test apparatus also comprising an access/store device electrically connected to the first I/O lines and a resistor connected between the first I/O lines and the second I/O lines, said method comprising the steps of:

resetting said first memory device and said second memory device by the testing utility synchronously;

transmitting a testing signal to said first memory device and said second memory device by the testing utility synchronously and successively, and transmitting a clock signal to said first memory device, said second memory device and said comparator circuit by the testing utility synchronously and successively;

comparing data on the first I/O lines and the second I/O lines by said comparator circuit; and generating an error signal from said comparator circuit when a predetermined criterion is met;

wherein said first memory device, operated by the testing signal, accesses and stores data from and into the access/store device, and wherein said comparator circuit is operated by the clock signal.

10. The method of claim 9, wherein said comparator circuit comprises:

a comparator comparing data on the first I/O lines and the second I/O lines for generating a comparison signal; and a flip-flop operated by the clock signal, said flip-flop receiving the comparison signal and generating the error signal when the predetermined criterion is met.

11. A method for testing a first IC device by use of an error-free second IC device identical to said first IC device and a comparator circuit, comprising the steps of:

resetting said first IC device and said second IC device synchronously;

transmitting a testing signal to said first IC device and said second IC device synchronously and successively, and transmitting a clock signal to said first IC device, said second IC device and said comparator circuit synchronously and successively;

comparing output of said first IC device with output of said second IC device by said comparator circuit; and generating an error signal from said comparator circuit when a predetermined criterion is met;

wherein said comparator circuit is operated by the clock signal.

12. The method of claim 11, wherein said comparator circuit comprises:

a comparator comparing output of said first IC device with output of said second IC device for generating a comparison signal; and a flip-flop operated by the clock signal, said flip-flop receiving the comparison signal and generating the error signal when the predetermined criterion is met.

* * * * *